United States Patent [19]

Tukamoto et al.

[11] Patent Number: 5,376,825
[45] Date of Patent: Dec. 27, 1994

[54] INTEGRATED CIRCUIT PACKAGE FOR FLEXIBLE COMPUTER SYSTEM ALTERNATIVE ARCHITECTURES

[75] Inventors: Takashi Tukamoto; Sachiyuki Abe; Tetsuo Yabushita; Yoshimitsu Hayashi, all of Suwa, Japan

[73] Assignee: Seiko Epson Corporation, Tokyo, Japan

[21] Appl. No.: 154,151

[22] Filed: Nov. 18, 1993

Related U.S. Application Data

[63] Continuation of Ser. No. 780,172, Oct. 21, 1991, abandoned.

[30] Foreign Application Priority Data

Oct. 22, 1990 [JP] Japan .................. 2-283762

[51] Int. Cl.$^5$ ................ H01L 23/02; H01L 23/12
[52] U.S. Cl. .................... 257/685; 257/686; 257/701; 257/724; 361/683; 361/684; 361/730; 361/735; 364/229; 364/230; 364/DIG. 1; 395/325; 395/800
[58] Field of Search .............. 357/74, 75, 76; 257/685, 686, 723, 724, 725, 701, 704; 361/683, 684, 728, 729, 730, 735; 395/325, 800; 364/DIG. 1, 229, 230

[56] References Cited

U.S. PATENT DOCUMENTS

| | | | |
|---|---|---|---|
| 3,939,452 | 2/1976 | Faggian | 340/172.5 |
| 3,984,813 | 10/1976 | Chung | 340/172.5 |
| 4,763,188 | 8/1988 | Johnson | 357/74 |
| 4,862,322 | 8/1989 | Bickford et al. | 361/386 |
| 4,947,234 | 8/1990 | Einzinger et al. | 357/68 |
| 4,953,060 | 8/1990 | Lauffer et al. | 361/388 |
| 4,970,577 | 11/1990 | Ogihara et al. | 357/74 |
| 4,994,902 | 2/1991 | Okahashi et al. | 357/80 |
| 5,012,323 | 4/1991 | Farnworth | 357/75 |

FOREIGN PATENT DOCUMENTS

| | | |
|---|---|---|
| 2193509 | 2/1974 | France . |
| 2244207 | 4/1975 | France . |
| 167340 | 12/1981 | Japan . |
| 088852 | 5/1984 | Japan . |
| 225438 | 11/1985 | Japan . |
| 054656 | 3/1986 | Japan . |
| 287133 | 12/1986 | Japan . |
| 285434 | 12/1987 | Japan . |
| 004633 | 1/1988 | Japan . |
| 138725 | 5/1989 | Japan . |
| 214035 | 8/1989 | Japan . |
| 062069 | 3/1990 | Japan . |
| 113543 | 4/1990 | Japan . |
| 142151 | 5/1990 | Japan . |
| 187880 | 7/1990 | Japan . |
| 1445663 | 8/1976 | United Kingdom . |
| 2053566 | 2/1981 | United Kingdom . |

*Primary Examiner*—Rolf Hille
*Assistant Examiner*—David Ostrowski
*Attorney, Agent, or Firm*—Harold T. Tsiang

[57] ABSTRACT

A single-packaged central processing unit (CPU) is formed on a substrate for a particular application in a variable word length computer system that includes a program memory. A first semiconductor chip in the CPU is of a general purpose type and includes a plurality of elements interconnected, such as an arithmetic logic unit (ALU), a program counter, and a register. A second semiconductor chip in the CPU is mounted on the first semiconductor chip with their active surfaces facing each other. The second semiconductor chip is configured for the particular application in accordance with a particular program instruction set stored in the program memory. The second semiconductor chip includes a command register for receiving fetched commands from the program memory, a command decoder for decoding the fetched commands and for generating corresponding control signals, and a timing generator for generating system clock signals. In one embodiment, the command register has a particular bit length for adapting to the particular application. In another embodiment, the command decoder has a particular bit length and the timing generator is configured to generate particular corresponding control signals for adapting to the particular application.

17 Claims, 6 Drawing Sheets

INTEGRATED CIRCUIT PACKAGE FOR FLEXIBLE COMPUTER SYSTEM ALTERNATIVE ARCHITECTURES

This is a continuation of copending application Ser. No. 07/780,172 filed Oct. 21, 1991, now abandoned.

BACKGROUND OF THE PRESENT INVENTION

The present invention relates to integrated circuit packaging of computer systems and more particularly to structures that allow some flexibility in computer architectures so that program and command wordlengths can be easily adjusted.

Central processing units (CPUs) are conventionally comprised of a basic control unit, an arithmetic logic unit (ALU), and several general/special purpose registers. All of which elements are now routinely integrated on a single monolithic semiconductor substrate as a direct result of advancements in semiconductor processing technology. The control unit, ALU, and registers are usually interconnected by various proprietary kinds of intra-chip buses (sometimes called micro-buses). Program commands and I/O data flow over these buses. The internal connections between the elements dramatically reduce the number of external connections that would otherwise be necessary. Quality and reliability experts have a rule-of-thumb that says a reduction in the number of external pins and their PC board connections will be directly reflected in an improvement in a system's reliability. Individual device reliability is often computed on the basis of how many pins the IC's in a system have. But high levels of integration reduce the flexibility a system designer has with customizing the architecture for particular applications. Since the interconnects are on-chip, they are not accessible to board and systems designers. So these engineers are stuck with whatever the chip designer decided to offer as a general compromise between conflicting applications that were envisioned at the time the chip was specified.

Each section and interconnect of a monolithic semiconductor CPU, quite naturally, has a fixed composition. Each CPU must therefore have a standardized fixed command (instruction) set. But non-monolithic implementations, even though they allow relatively mixing and matching each of the elements of a central processing unit, have serious disadvantages. For example, the required complex interconnections invite high failure rates. Being able to select a system optimal to its application is very compelling and can tip the scales in that direction.

A major advantage of semiconductor integrated circuit technology is that many electronic elements are microminiaturized at the same time in a single array. However, central processing units rarely have flat, non-hierarchical structures. For example, a command register receives program commands from program memory and then sends these commands to a command decoder. The command decoder deciphers the program commands and sends out micro-commands (also called microcode). More complex and larger instructions can make use of wider microcodes, and do more in parallel. Fewer instructions are needed to implement each step in a program. A reduction in power consumption is possible if the number of elements in a command that must be fetched can be reduced. Conversely, if the length of a command word is made shorter, the processing of the command can be reduced, because the decoding is less complicated, and timing generators can be simplified. High-speed processing is possible because faster clocks can be used.

Therefore, the present invention allows a chip having a command register, a command decoder, and a timing generator to be swapped in to and out from the rest of a CPU. This makes it easy to change command and instruction sets.

SUMMARY OF THE PRESENT INVENTION

According to the present invention, a command register, a decoder, and a timing generator are integrated into a second chip. A control section and an arithmetic logic unit (ALU) are integrated into a first, "general purpose" chip. The two chips together constitute a familiar CPU. Both chips are disposed within a single device package to eliminate interconnect concerns, and they are coupled to a common leadframe. The second chip is stacked face down on the top of first chip to keep interconnects short. The active surfaces of both chips are in contact with one another.

An advantage of the present invention is that various program command word lengths can be accommodated by swapping in different second chips.

Another advantage of the present invention is that if the word lengths of commands in a program memory are long enough, arithmetic operations can be executed in one command fetch. This reduces the overall program fetch time used.

Another advantage of the present invention is that there can be a significant reduction in power consumption and consequently a longer battery life.

Another advantage of the present invention is that if the command word lengths in program memory are short, high speed processing is possible because of a simpler timing generator can be implemented.

Another advantage of the present invention is that the word lengths in program memory can be easily increased.

Another advantage of the present invention is that a variety of second chips can be produced each in small lots, and the first chip can be produced in one version and in quantity. Depending on how they are combined, a low cost and :diversified computer can be offered by tailoring the product to the application in which it will be used.

Another advantage of the present invention is that the two-chip construction solves the heat generation problem, and higher speeds, compared to single-chip devices, are possible.

Other objects and attainments together with a fuller understanding of the present invention will become apparent and appreciated by referring to the following description and claims taken in conjunction with the accompanying drawings.

DESCRIPTION OF THE PREFERRED EMBODIMENTS

Figure 1:
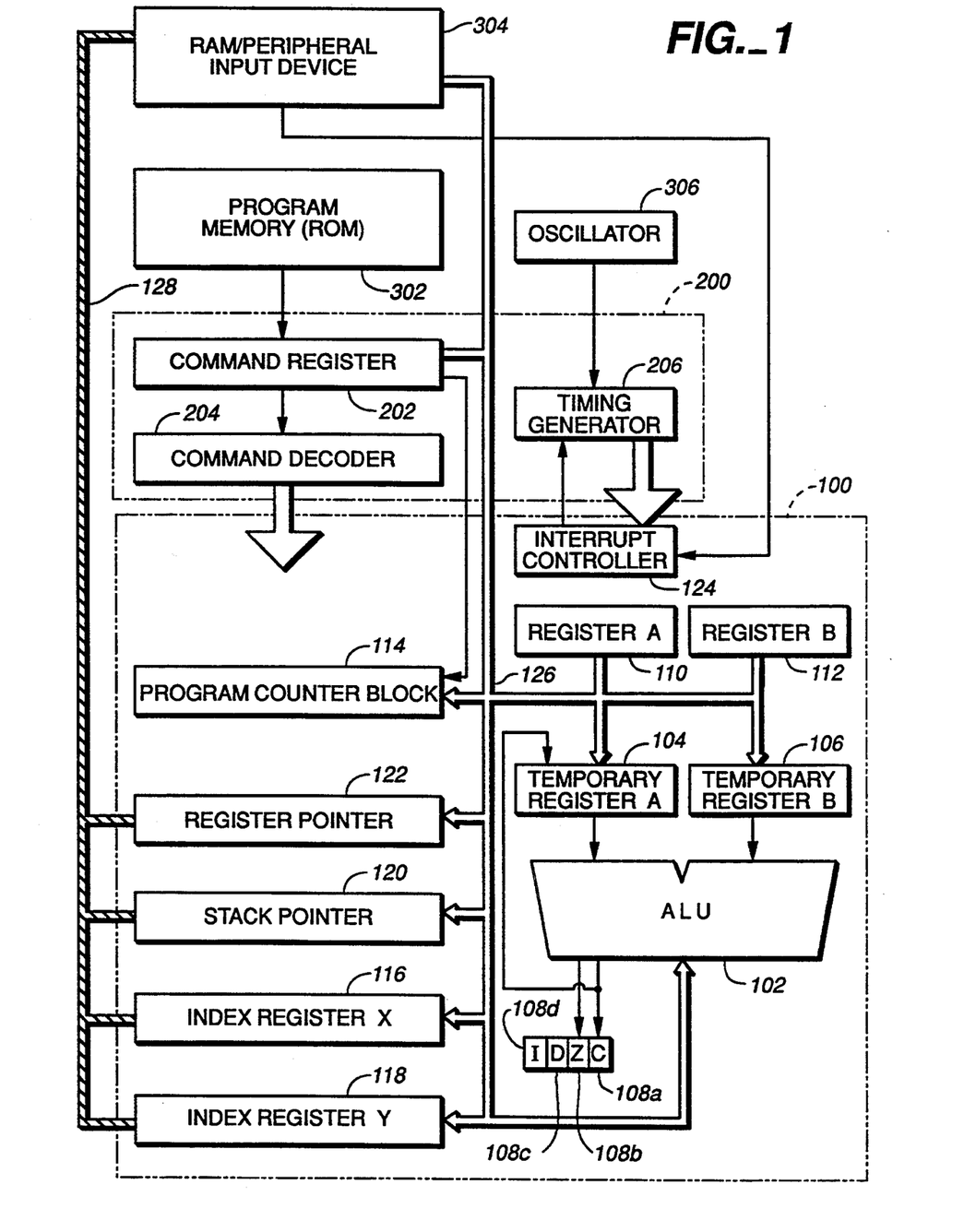
FIG. 1 is a functional block diagram of a variable word length computer system, according to a first embodiment of the present invention.

In FIG. 1, a first embodiment of the present invention is a variable word length computer system, comprised of two major parts, a 4-bit "general purpose" chip 100 and a command chip 200. Preferably, chips 100 and 200 are sealed together in the same device package. General purpose chip 100 has an arithmetic logic unit (ALU) 102; registers 104, 106, 110, and 112; a program counter 114; index registers 116 and 118; a stack pointer 120; a register pointer 122; and an interrupt controller 124. ALU 102 performs arithmetic operations between (4-bit) data stored in temporary registers 104 and 106. ALU 102 can do addition with carry (ADC), addition without carry (ADD), subtraction with borrow (SBC), subtraction without borrow (SUB), logical AND (AND), logical OR (OR), exclusive logical OR (XOR) comparison (CP), bit test (FAN) right rotation with carry (RRC), left rotation with carry (RLC), inversion (NOT), and more. When the arithmetic operation results of ALU 102 are all zero, a"Z" flag 108$b$ (zero flag) will be set. When an addition carry result is generated and when a subtraction borrow is generated, a "C" flag 108$a$ (carry flag) will be set. By setting a "D" flag 108$c$ (digital flag), for decimal arithmetic operations mode, addition and subtraction will be BCD. Registers 110 and 112 are each 4-bit general purpose registers and function as accumulators. Chip 200 is comprised of a command register 202, a command decoder 204, and a timing generator 206. A program memory 302 supplies macrocode to command register 202. An oscillator 306 clocks timing generator 206.

Figure 2:
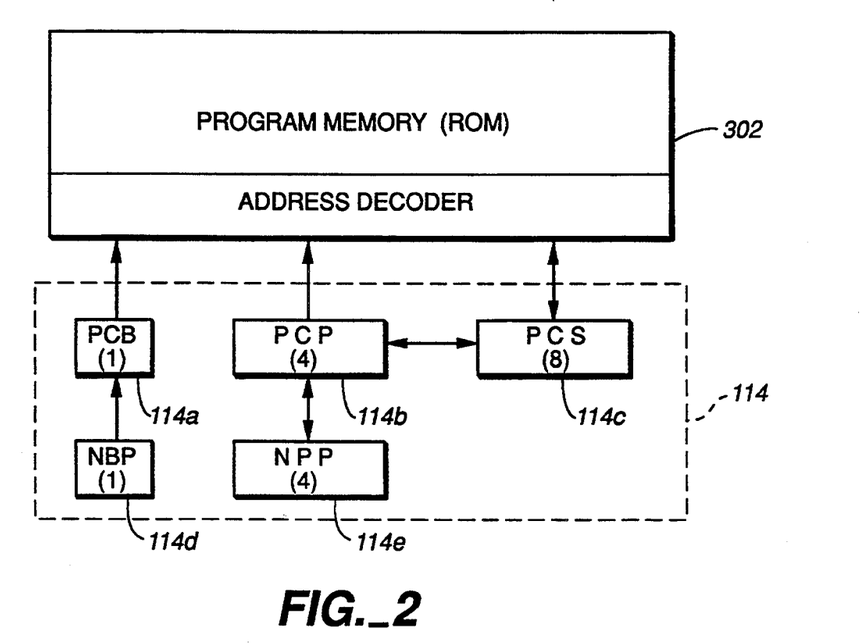
FIG. 2 is a block diagram of a program counter block in the computer system of FIG. 1.

In FIG. 2, program counter 114 comprises two registers and three counters that address for command register 202 the various memory areas of program memory 302, described below. A program counter bank (PCB) 114$a$ is a 1-bit counter that designates a program memory bank area. A program counter page (PCP) 114$b$ is a 4-bit counter of the program memory page area. A program counter step (PCS) 114$c$ is an 8-bit counter that designates the memory word step area. The program memory address therefore comprises 13 bits. A new bank pointer (NBP) 114$d$ is a 1-bit register used for a branch destination bank address. When a branch command has been executed, the value of new bank pointer (NBP) 114$d$ is loaded into program counter bank 114$a$. New page pointer (NPP) 114$e$ is used for a page section register. When a branch command is executed, a value for the new page pointer 114$e$ is loaded into program counter page 114$b$. Index register 116 is comprised of a 4-bit page section register and an 8-bit pre-settable counter. A maximum of 4,096 words can be specified. Index registers 118 and 116 are similar, and each has a 4-bit page section register and an 8-bit presettable counter. A maximum of 4,096 words can be specified. Stack pointer 120 is an 8-bit register that designates data memory stack address. Register pointer 122 is a 4-bit register for the data memory register address. Interrupt controller 124 can generate a maximum of 15 interrupt vectors for various interrupt requests from peripherals and internal elements. An interrupt enable/disable is specified by means of interrupt flag "I" 108$d$. When the "I" flag 108$d$ is set, interrupts are enabled. When it is reset, interrupts are disabled. A bus 126 is a 4-bit data bus and a bus 128 is an 8-bit address bus.

Figure 3:
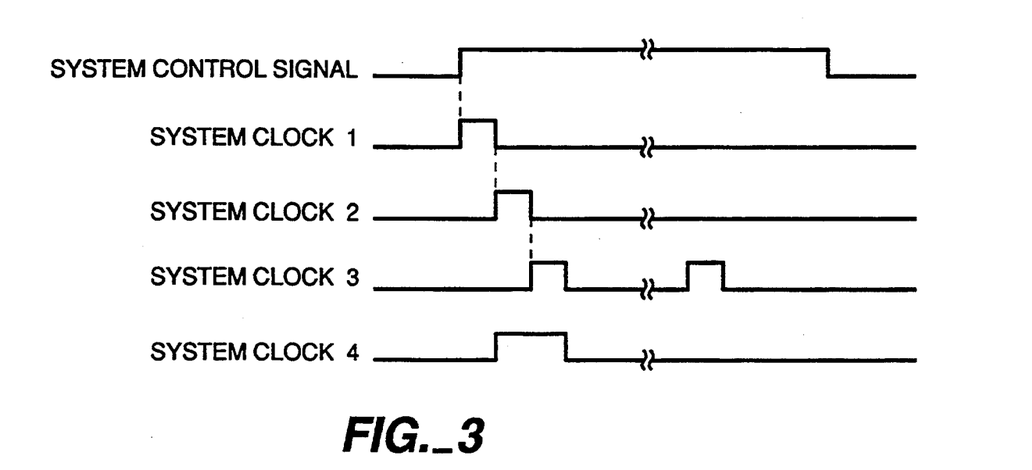
FIG. 3, is a timing chart of various system clocks generated by the timing generator of the command chip of the computer system of FIG. 1.

Command register 202 receives fetches of commands from program memory 302. Command decoder 204 then decodes the (macro) command codes and generates corresponding microcode comprised of many different basic control signals. Among the control signals are a program counter control signal, a system control signal, an arithmetic operation control signal, a register control signal, a memory control signal, a flag control signal, a stack pointer control signal, a RAM expansion index register control signal, et cetera. Timing generator 206 produces a number of different system clocks that respond to commands that have different numbers of command cycles. For example, in FIG. 3, the first through fourth system clocks depend on particular system control signals that are then in effect.

The program instruction set (command repertory) influence the makeup of control signals from command decoder 204, the bit length of command register 202, and the bit length of the system clock of timing generator 206, all of which are on the command chip 200. The internal composition of general purpose chip 100 does not change, even if different instruction sets are being used. If the word length of the commands in the program memory is long, savings in battery power consumption can be realized. Command chip 200 is combined with general purpose chip 100. As such, it is possible to execute several arithmetic logic operations with one command fetch. In reducing the number of command fetches, a reduction in power consumption and a longer battery life results.

Conversely, when a high speed system is formed that requires only a limited amount of processing, the command words can be shortened, and command chip 200, which corresponds to the system, is combined with general purpose chip 100. Higher speed processing can be accomplished by means of the simplification of timing generator 206 and the simplification of command decoder 204 in terms of command chip 200 in the case.

In a 4-bit CPU, there are typically 70 control signals that must be output from command decoder 204, and 40 system clock lines output from timing generator 206.

Figure 4A:
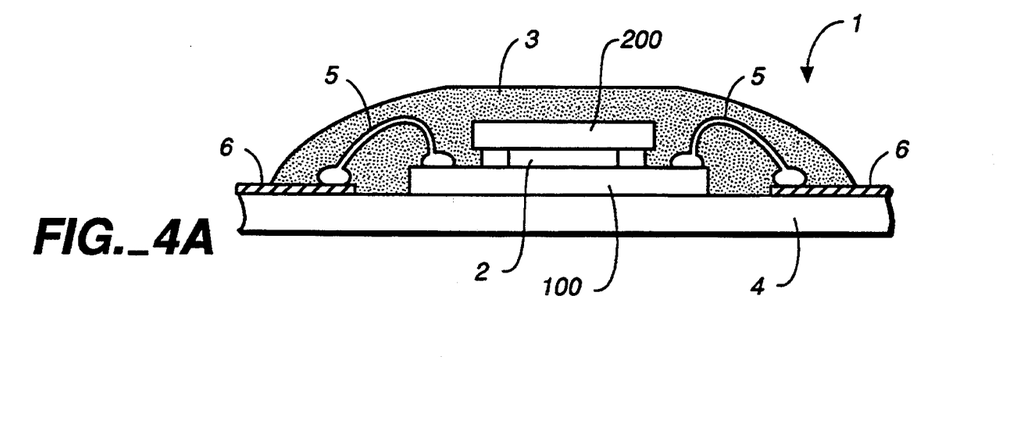
FIG. 4A is a cross section of a wire-bonded chip-on-board type of package for the computer system of FIG. 1.
Figure 4B:
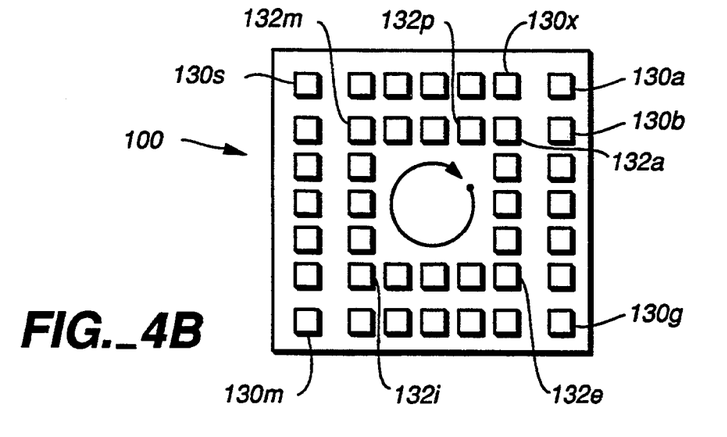
FIG. 4B is a view of the active surface of chip 100 showing pads (contacts) in two concentric squares about the periphery. The clockwise arrow represents the direction of increasing pin numbers.
Figure 4C:
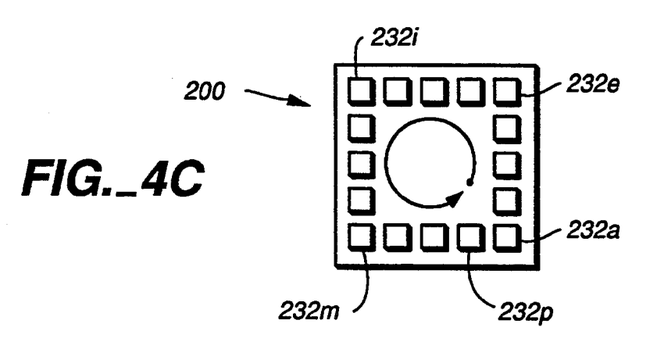
FIG. 4C is a view of the active surface of chip 200 showing pads (contacts) arranged in a square about the periphery. The counter-clockwise arrow represents the direction of increasing pin numbers and matches that of FIG. 4B when chips 100 and 200 are assembled face-to-face as in FIG. 4A.

FIG. 4A shows a cross section of a package 1 comprising general purpose chip 100, which is mounted to a substrate 4. Chip 200 is stacked on top of general purpose chip 100. In FIG. 4B, pads on the surface of chip 100 make external connections to pads 132a through 130x. In FIG. 4C, pads 232a through 232p are located on one surface of chip 200. Pads 232a to 232p are laid out such that they line up with inter-chip connecting pads 132a to 132p. Pads 130a to 130x are connected to a plurality of printed circuits 6 through a plurality of bonding wires 5. Within printed circuit 6 are a data bus 126 and an address bus 128. Chip 200 has its active surface facing the active surface of chip 100. Pads 232a to 232p of chip 200 and the interchip connection pads 132a to 132p are coupled by a silver paste 2 that can have sufficient bonding strength, if a heat hardened silver paste is used. Control signals from chip 200 that are not used by chip 100 (e.g., memory control signals) simply pass through to the bonding wires and the printed circuits. A clock from oscillator 306 (FIG. 1) passes through the printed circuits, bonding wires, the pads, the wiring within chip 100, the inter-chip connecting pads and chip 200. In order to protect chips 100 and 200 and to protect bonding wires 5, they are covered with a resin molding material 3.

Figure 5:
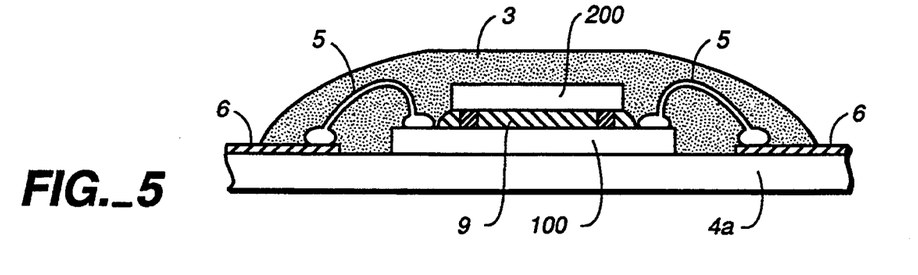
FIG. 5 is a cross section of a package similar to that of FIG. 4A, but with an anistropic layer connecting chip 100 to chip 200.

FIG. 5 shows an anisotropic conductive material 9 being used in place of silver paste 2 between the gap between Chip 100 and Chip 200. Material 9 conducts only across the film thickness in one direction, and only corresponding pads will be connected.

Operating speed will be reduced if the signal length between chip 100 and chip 200 is too long, because the line resistance and line capacitance will increase. But in the present invention, the two chips have their active surfaces facing toward each other and the corresponding pads are connected. This makes for an extremely short connection length. So, line resistance and line capacitance will be insignificant.

With the above construction, a quick response to new applications is possible. This is possible by starting with a uncompleted product, having only chip 100 on substrate 4, and choosing a new command chip from among a series of chips.

Figure 6A:
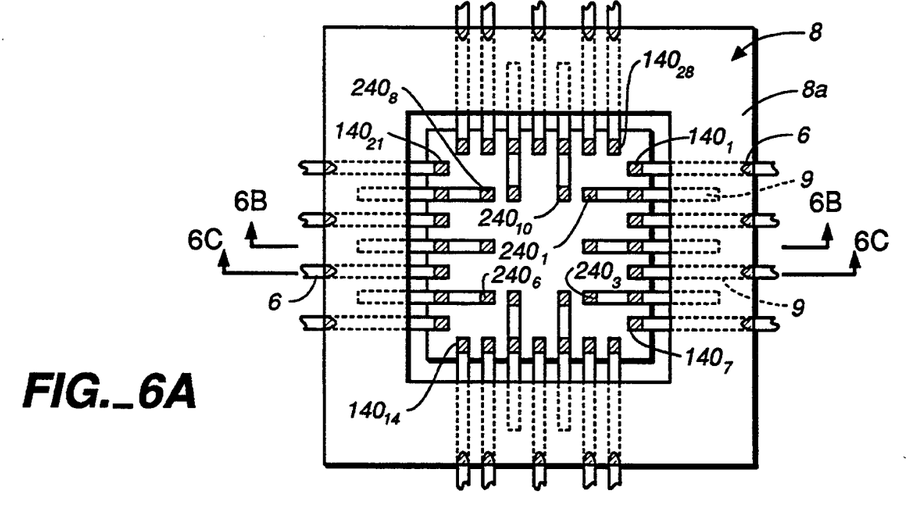
FIG. 6A is a top view of a tape automated bonded (TAB) type chip-on-board type of package for the computer system of FIG. 1.
Figure 6B:
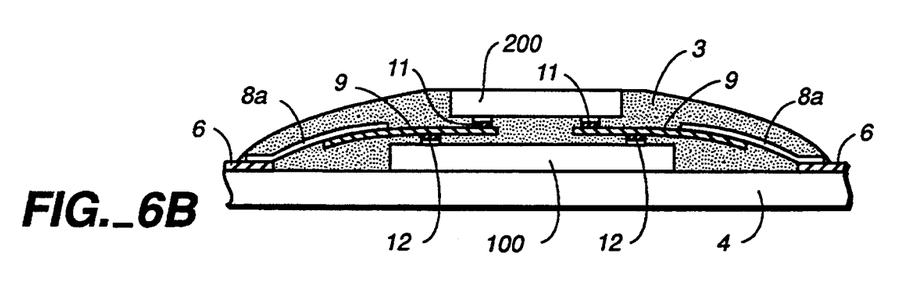
FIG. 6B is a cross sectional diagram of the package of FIG. 6A taken along the;line 6B—6B. This cross-section intersects certain printed wires connecting chip 100 to chip 200.
Figure 6C:
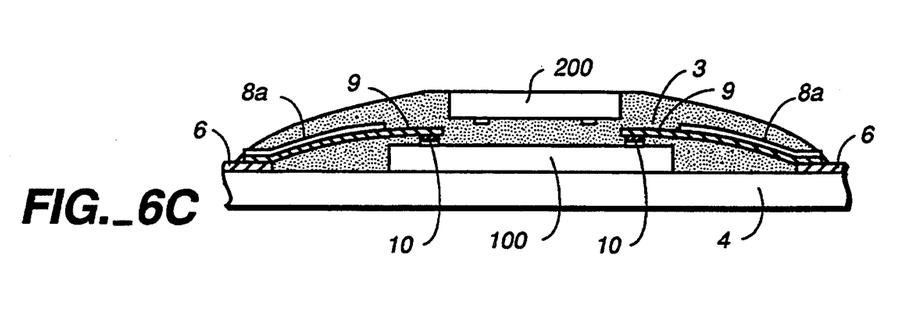
FIG. 6C is a cross sectional diagram of the package of FIG. 6A taken along the line 6C—6C. This cross-section intersects certain printed wires connecting the substrate and chip 100.

FIGS. 6A–6C show a second way to package parts of the computer system of FIG. 1. A flexible circuit 8 having flex wires 9 makes the necessary connections between the outside and chips 100 and 200 (instead of bonding wires). FIG. 6B is a cross-section that shows how wires 9 interconnect chips 100 and 200 and are carried by a film portion 8a attached to substrate 4 via circuit 6. FIG. 6C is a cross-section that shows how wires 9 interconnect chip 100 with the outside. A plurality of pads $104_1$ through $104_{28}$ are positioned in a square pattern at a predetermined pitch (lead spacing) along the perimeter of chip 100. Pads $240_1$ to $240_{10}$ are also grouped in a square on chip 200, which is smaller than its counterpart on chip 100. The latter are set at a second predetermined pitch, which may or may not be the same as the first pitch. In FIG. 6C, a connection is made between the pads on chip 100 and printed circuit 6 by flexible circuit 8. The one end of each of wires 9 connect to the pads via bumps 10. In FIG. 6B, bumps 11 connect the pads of chip 200 to printed circuit wires 9 which then connect with bumps 12. Printed wires 9 are supported by flexible film 8a. Chip 200 is initially supported in its mid-air position above chip 100 during the packaging process by wires 9. Then, in order to add strength and protection from the environment, chips 100 and 200 are encapsulated in a resin molding material 3 (e.g., epoxy).

In the packaging process, chip 100 has flexible circuit 8 aligned on top. Inner edges of printed wires 9 are gang bonded to the pads on chip 100. Prior to soldering, bumps 11 are formed on the pads of chip 200. Chip 200 is then aligned with flexible circuit 8, and the pads of chip 200 are reflow soldered to wires 9. The outer edges of printed wires 9 and printed circuit 6 are connected. Then resin 3 is molded to cover and fortify the delicate chips and their connections.

Figure 7:
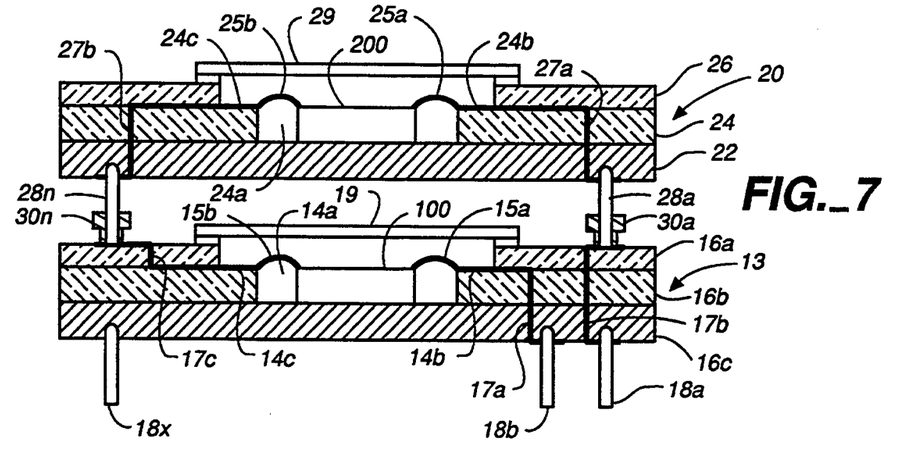
FIG. 7 is a cross sectional diagram of a pair of stackable PGA packages for the computer system of FIG. 1.
Figure 8:
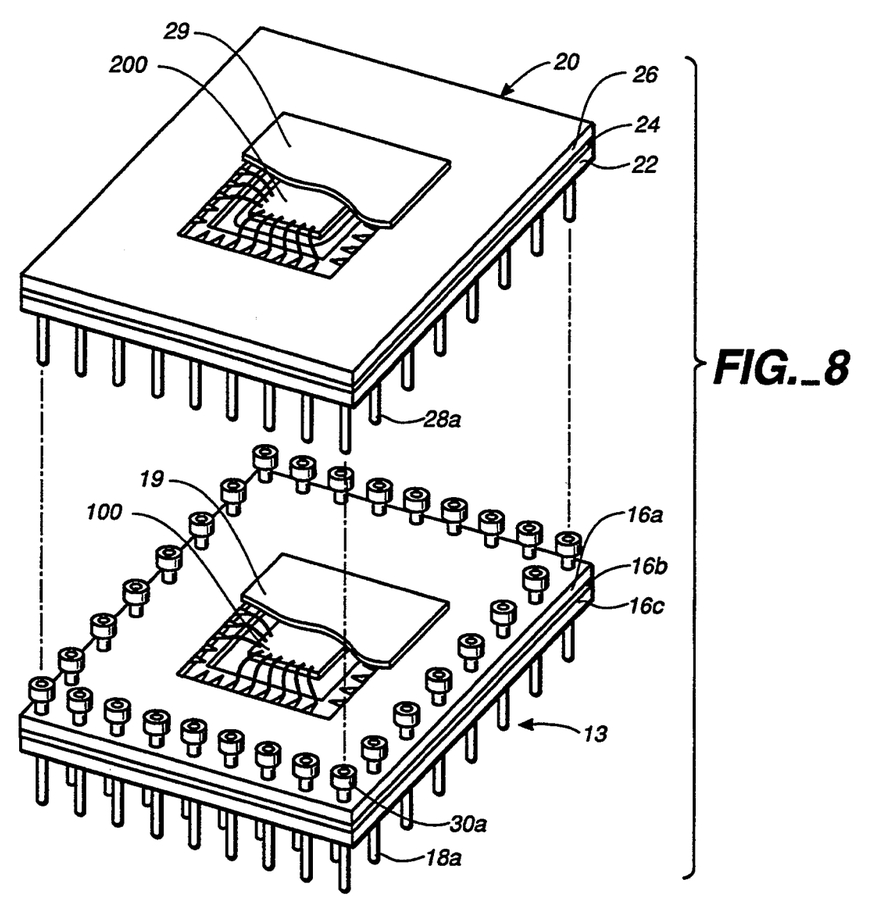
FIG. 8 is three dimensional perspective view of the packages of FIG. 7.

FIGS. 7 and 8 show a third embodiment of the present invention that can be used to package part of the computer system of FIG. 1. A pin grid array package (PGA) 20 is stacked onto a PGA 13, which has three ceramic layers 16a, 16b and 16c. A plurality of pins 18a to 18x are assembled into layer 16c. A cavity 14a allows chip 100 to be fixed in the middle. Center ceramic layer 16b and upper ceramic layer 16a have wiring patterns 14b and 14c formed in gold, and are connected to bonding wires 15a and 15b. One end of gold wire pattern 14b connects to a through-hole plated wire 17a and to the base of pin 18b. Pin 18b is therefore electrically connected to chip 100. A lid 19 covers chip 100. PGA 20 also has three ceramic layers, these are layers 22, 24 and 26. Pins 28a to 28n are assembled into lower ceramic layer 22. Chip 200 is mounted in chip cavity 24a near the middle of ceramic layer 24. Gold wiring patterns 24b and 24c are routed between layers 24 and 26. Bonding wires 25a and 25b connect the pads on chip 200 with gold wiring patterns 24b and 24c. Gold wiring pattern 24b connects to pin 28a by a through-hole plated wire 27a. And, gold wiring pattern 24c is connected to pin 28n by a through-hole plated wire 27b. A plurality of sockets 30a to 30n are assembled in upper ceramic layer 16a. Pins 28a to 28n are such that they will fit into sockets 30a to 30n. For example, chip 200 connects to pin 18a via wire 27a, pin 28a, socket 30a and through-hole plated wire 17b. Chip 100 can be interconnected with chip 200, for example, by bonding wire 25b, plated wire 24c, through-hole wire 27b, pin 28n, socket 30n, through-hole wire 17c, plated wire 14c and bonding wire 15b. Chip 200 is covered by lid 29.

Figure 9:
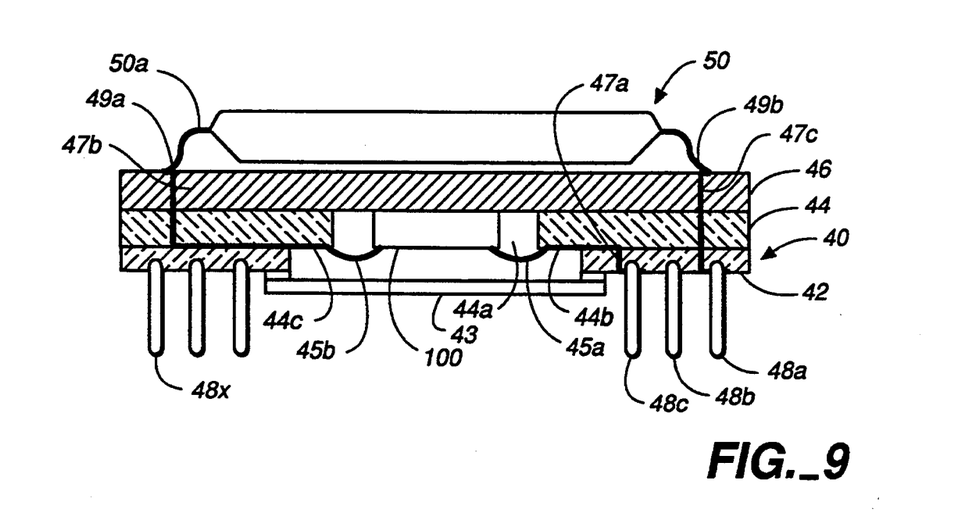
FIG. 9 is a cross section of a surface mount type of QFP package mounted on a PGA type package, the pair containing chips 100 and 200 for the computer system of FIG. 1.
Figure 10:
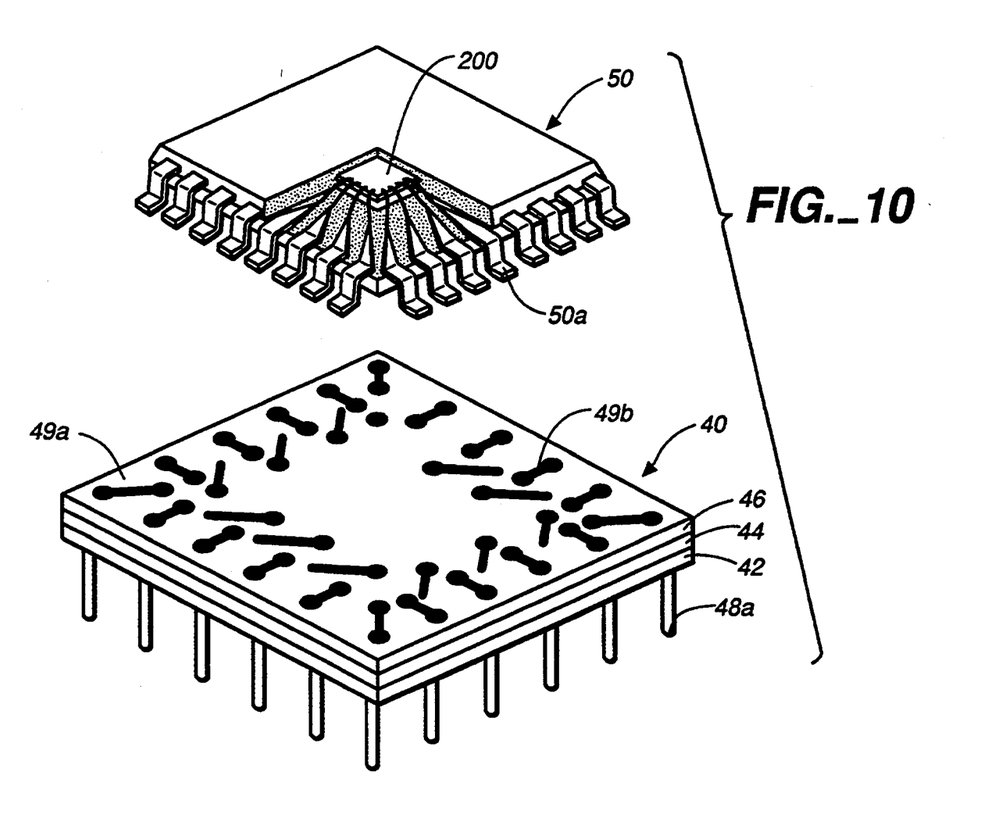
FIG. 10 is three dimensional perspective view of the packages of FIG. 9.

FIGS. 9 and 10 represent a fourth embodiment of the present invention which is a package that can house part of the computer system of FIG. 1. FIG. 10 show a diagonal exploded view of the number of the same structure. A quad flat package (QFP) 50 is soldered to the top of a PGA package 40. PGA 40 has three stacked ceramic layers 42, 44 and 46, similar to PGA 13. Pins 48a to 48x are assembled in lower layer 42. Chip 100 is mounted face down in chip cavity 44a, near the middle of ceramic layer 44. A predetermined wiring pattern is placed between the ceramic layers for interconnect. Gold wiring patterns 44b and 44c are positioned between lower and middle layers. The pads and the gold wiring patterns are connected by bonding wires 45a and 45b. For example, gold wiring pattern 44b is connected to pin 48c by through-hole plated wire 47a. Gold wiring pattern 44c is connected to gold wiring pattern 49a of upper layer through through-hole plated wire 47b. Gold wiring pattern 49b is connected to pin 48a by through-hole plated wire 47c. QFP package 50 houses command chip 200. A plurality of outer leads 50a match up with respective wiring patterns (e.g., patterns 49a and 49b) on the top of ceramic layer 46. Bonding of QFP 50 to PGA 40 can be done with a conventional solder reflow method. Chip 100 is mounted upside down in cavity 44a and is covered by lid 43. The length of the outer leads 50a are shorter than those of PGA 20 (FIG. 7). So the interconnect of chips 100 and 200 is shorter. As a result, even though there are two discrete packages, the wiring capacitance and resistance between chips 100 and 200 are significantly reduced from what would otherwise exist.

While the present invention has been described in conjunction with several specific embodiments, it is evident to those skilled in the art that many further alternatives, modifications and variations will be apparent in light of the forgoing description. Thus, the present invention described herein is intended to embrace all such alternatives, modifications, applications and variations as may fall within the spirit and scope of the appended claims.

What is claimed is:

1. A single-packaged central processing unit (CPU) formed on a substrate for a particular application in a variable word length computer system that includes a program memory, the CPU comprising:
    a first semiconductor chip of a general purpose type comprising a plurality of elements including an arithmetic logic unit (ALU), a program counter, at least one register, and means for interconnecting the elements, said first semiconductor chip having an active surface; and
    a second semiconductor chip having an active surface and mounted on said first semiconductor chip such that the active surface of said first semiconductor chip is facing the active surface of said second semiconductor chip, said second semiconductor chip configured for the particular application and comprising:
        a command register for receiving fetched commands from the program memory,
        a command decoder for decoding the fetched commands and for generating corresponding control signals for supplying to said first semiconductor chip, and
        a timing generator for generating system clock signals for supplying to said first semiconductor chip;
    wherein said first semiconductor chip performs operations in accordance with the control signals generated by said command decoder of said second semiconductor chip.

2. The CPU of claim 1 wherein said second semiconductor chip is configured for the particular application in accordance with a particular program instruction set stored in the program memory.

3. The CPU of claim 2 wherein said command register has a particular bit length for adapting to the particular application.

4. The CPU of claim 2 wherein said command decoder has a particular bit length and said timing generator is configured to generate particular corresponding control signals for adapting to the particular application.

5. The CPU of claim 4 wherein said command register has a particular bit length for adapting to the particular application.

6. The CPU of claim 5 wherein each of said first and second semiconductor chips includes a plurality of pads attached on their respective active surfaces, with the pads on said first semiconductor chip arranged in first and second groups with the first group for coupling to the external circuits and the second group for contacting the pads on said second semiconductor chip.

7. The CPU of claim 6 wherein the first group of pads is arranged along the perimeter of said first semiconductor chip and the second group of pads is arranged concentrically with the first group of pads, and the pads on said second semiconductor chip are arranged so that they are aligned with the second group of pads.

8. The CPU of claim 6, further comprising heat-hardened silver paste coupling the second group of pads on said first semiconductor chip to the pads on said second semiconductor chip and a resin molding material encapsulating said first and second semiconductor chips.

9. The CPU of claim 6, further comprising anisotropic conductive material coupling the second group of pads on said first semiconductor chip to the pads on said second semiconductor chip and a resin molding material encapsulating said first and second semiconductor chips.

10. The CPU of claim 2, further comprising:
    a circuit frame mounted on the substrate and having an opening wherein said first and second semiconductor chips are disposed;
    a plurality of wires attached to said circuit frame and arranged in first and second groups of wires, said first and second groups of wires extending toward said first and second semiconductor chips such that said first group of wires connects said first semiconductor chip to the external circuits through portions of said circuit frame and said second group of wires connects said second semiconductor chip to said first semiconductor chip; and
    a resin molding material encapsulating said first and second semiconductor chips.

11. A single-packaged central processing unit (CPU) formed on a substrate for a particular application in a variable word length computer system that includes a program memory storing a particular program instruction set, the substrate including means for coupling the CPU to external circuits, the CPU comprising:
    first chip means of a general purpose type comprising a plurality of elements including an arithmetic logic unit (ALU), a program counter, at least one register, and means for interconnecting the elements, said first chip means having an active surface; and
    second chip means having an active surface and mounted on said first chip means such that the active surface of said first chip means is facing the active surface of said second chip means, said second chip means configured for the particular application in accordance with the particular program instruction set, said second chip means comprising:
        means for receiving fetched commands from the program memory,
        means for decoding the fetched commands and for generating corresponding control signals for supplying to said first chip means, and
        means for generating system clock signals for supplying to said first chip means;

wherein said first chip means performs operations in accordance with the control signals generated by said decoding means of said first chip means.

12. The CPU of claim 11 wherein each of said first and second chip means includes a plurality of pads attached on their respective active surfaces, with the pads on said first chip means arranged in first and second groups with the first group for coupling to the external circuits and the second group for contacting the pads on said second chip means.

13. An integrated circuit package, comprising:
a first pin grid array package including:
  a first ceramic layer having a plurality of connector pins,
  a second ceramic layer mounted on said first ceramic layer and having an opening,
  a third ceramic layer mounted on said second ceramic layer and having an opening larger than and over the opening of said second ceramic layer, said third ceramic layer including a plurality of sockets,
  a first semiconductor chip mounted on said first ceramic layer within the two openings,
  a plurality of connection means for coupling said first semiconductor chip to a selected number of said sockets, for coupling said first semiconductor chip to a selected number of said connector pins, and for coupling a selected number of said sockets to a selected number of said connector pins, and
  a lid mounted on said third ceramic layer and covering said first semiconductor chip; and
a second package including:
  a first ceramic layer having a plurality of connector pins respectively coupled to said sockets on said third ceramic layer in said first package,
  a second ceramic layer mounted on said first ceramic layer in said second package and having an opening,
  a third ceramic layer mounted on said second ceramic layer in said second package and having an opening larger than and over the opening of said second ceramic layer in said second package,
  a second semiconductor chip mounted on said first ceramic layer in said second package within the two openings in said second package, and coupled to said connector pins on said first ceramic layer in said second package, and
  a lid mounted on said third ceramic layer and covering said second semiconductor chip;
  wherein said first and second semiconductor chips are electrically coupled together and form a central processing unit (CPU).

14. The package of claim 13 wherein said second package is a pin grid array package (PGA).

15. The package of claim 13 wherein
said first semiconductor chip is of a general purpose type comprising a plurality of elements including an arithmetic logic unit (ALU), a program counter, at least one register, and means for interconnecting the elements;
said second semiconductor chip is configured for a particular application in accordance with a particular program instruction set and includes:
  a command register for receiving fetched commands,
  a command decoder for decoding the fetched commands and for generating corresponding control signals for supporting to said first semiconductor chip, and
  a timing generator for generating system clock signals for supplying to said first semiconductor chip; and wherein
said first semiconductor chip perform operations in accordance with the control signals generated by said command decoder of said second semiconductor chip; and
said first and second semiconductor chips form a central processing unit (CPU) for the particular application in a variable word length computer system that includes the program memory storing the particular instruction set.

16. An integrated circuit package, comprising:
a first package including:
  a first ceramic layer,
  a second ceramic layer mounted on said first ceramic layer and having an opening,
  a third ceramic layer mounted on said second ceramic layer and having an opening larger than and over the opening of said second ceramic layer, said third ceramic layer including a plurality of connector pins,
  a first semiconductor chip mounted on said first ceramic layer within the two openings, said first semiconductor chip being of a general purpose type and comprising a plurality of elements including an arithmetic logic unit (ALU), a program counter, at least one register, and means for interconnecting the elements.
  a plurality of connection means for coupling said first semiconductor chip to a selected number of said connector pins, for coupling said first semiconductor chip to external circuits, and for coupling a selected number of said connector pins to the external circuits, and
  a lid mounted on said third ceramic layer and covering said first semiconductor chip; and
a second package including:
  a second semiconductor chip coupled to said first semiconductor chip and a selected number of said connector pins via said connection means, said second semiconductor chip being configured for a particular application in accordance with a particular program instruction set and including:
    a command register for receiving fetched commands,
    a command decoder for decoding the fetched commands and for generating corresponding control signals for supplying to said first semiconductor chip, and
    a timing generator for generating system clock signals for supplying to said first semiconductor chip;
  wherein said first semiconductor chip performs operations in accordance with the control signals generated by said command decoder of said second semiconductor chip; and
  said first and second semiconductor chips form a central processing unit (CPU) for the particular application in a variable word length computer system that includes a program memory storing the particular instruction set.

17. The package of claim 16 wherein said second package is a quad flat package (QFP).

* * * * *

UNITED STATES PATENT AND TRADEMARK OFFICE
CERTIFICATE OF CORRECTION

PATENT NO. : 5,376,825
DATED : December 27, 1994
INVENTOR(S) : Takashi Tsukamoto et al.

It is certified that error appears in the above-identified patent and that said Letters Patent is hereby corrected as shown below:

Cover Page, item [75] inventor:

Line 2, Change name of Inventor, "Tukamoto et al." to --Tsukamoto et al.--.

Line 6, after "[75] Inventors: Takashi", change "Tukamoto" to --Tsukamoto--.

Signed and Sealed this

Twelfth Day of December, 1995

Attest:

BRUCE LEHMAN

*Attesting Officer*  *Commissioner of Patents and Trademarks*